United States Patent

Kakoschke et al.

[11] Patent Number: 5,981,342
[45] Date of Patent: Nov. 9, 1999

[54] METHOD OF MAKING A SEMICONDUCTOR COMPONENT WITH COMPENSATION IMPLANTATION

[75] Inventors: Ronald Kakoschke; Holger Sedlak, both of Münich, Germany

[73] Assignee: Siemens Aktiengesellschaft, Munich, Germany

[21] Appl. No.: 08/858,819

[22] Filed: May 19, 1997

[30] Foreign Application Priority Data

May 17, 1996 [DE] Germany ............ 196 20 032

[51] Int. Cl.⁶ .............................. H01L 21/8247
[52] U.S. Cl. ........................... 438/266; 438/264
[58] Field of Search ................... 438/266, 264; 257/321, 322

[56] References Cited

U.S. PATENT DOCUMENTS

| | | | |
|---|---|---|---|
| 4,622,737 | 11/1986 | Ravaglia | 29/571 |
| 5,501,996 | 3/1996 | Yang et al. | 437/43 |
| 5,585,293 | 12/1996 | Sharma et al. | 437/43 |
| 5,814,543 | 9/1998 | Nishimoto et al. | 438/264 |

OTHER PUBLICATIONS

Adan, A.O. et al., A scaled .6/spl mu/m high speed PLD technology using single–poly EEPROM's, Custom Integrated Circuits Conference, Proceeding of the IEEE, pp. 55–58, 1995.

Feldmann, U. et al., Concurrent technology, device, and circuit development for EEPROMs, Design Automation Conference, Proceedings of the ASP–DAC '98. Asia and South Pacific, pp. 123–128, 1998.

Kakoschke, R. et al., Concurrent technoloty, device, and circuit development for EEPROMs, Simulation of Semiconductor Processes and Devices, SISPAD '97., International Conference on, pp. 193–196, 1997.

*Primary Examiner*—Olik Chaudhuri
*Assistant Examiner*—Daniel Mae
*Attorney, Agent, or Firm*—Herbert L. Lerner; Laurence A. Greenberg

[57] ABSTRACT

A semiconductor component, in particular an EEPROM, and a production method therefor, avoid an avalanche breakdown from a buried channel to a substrate through the use of a special lateral dopant profile in the buried channel, in which a peripheral zone of the buried channel has a higher effective doping than a region located below a tunnel window. The lateral dopant profile is produced through the use of a compensation implantation with dopant atoms of the conduction type opposite that of the buried channel.

9 Claims, 5 Drawing Sheets

— BAND-STRUCTURE
INITIAL PHASE
— BAND-STRUCTURE
EQUILIBRIUM PHASE

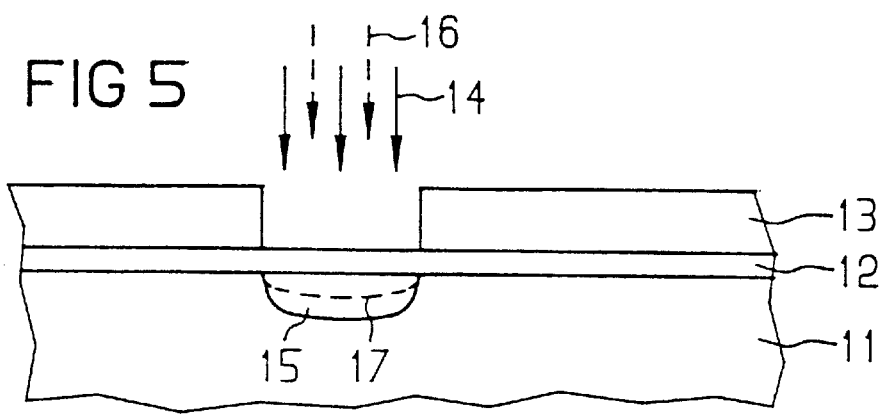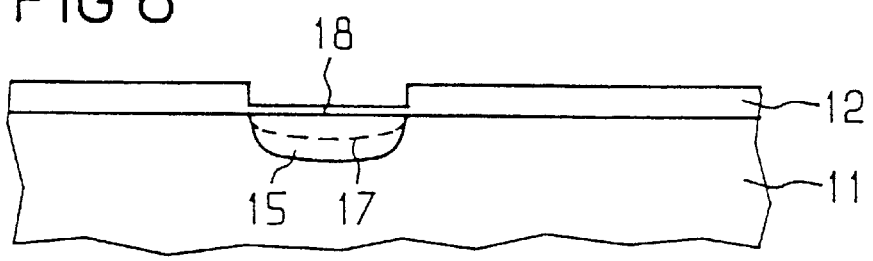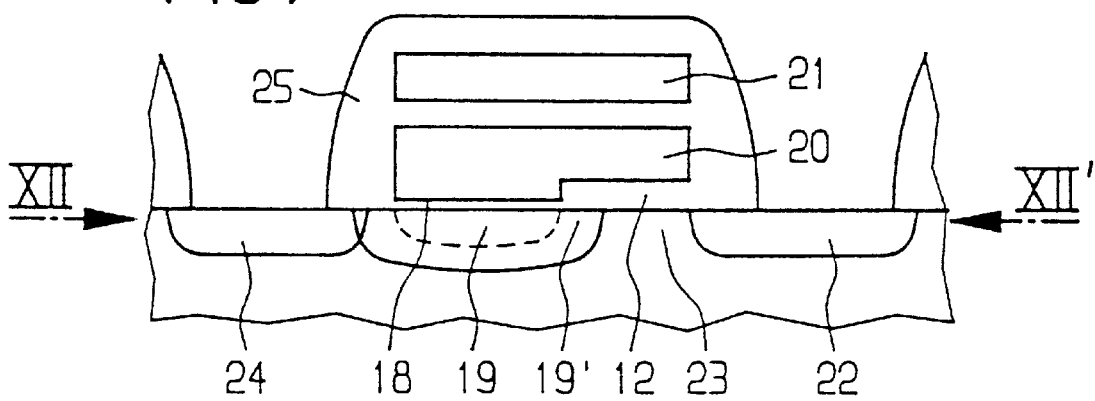

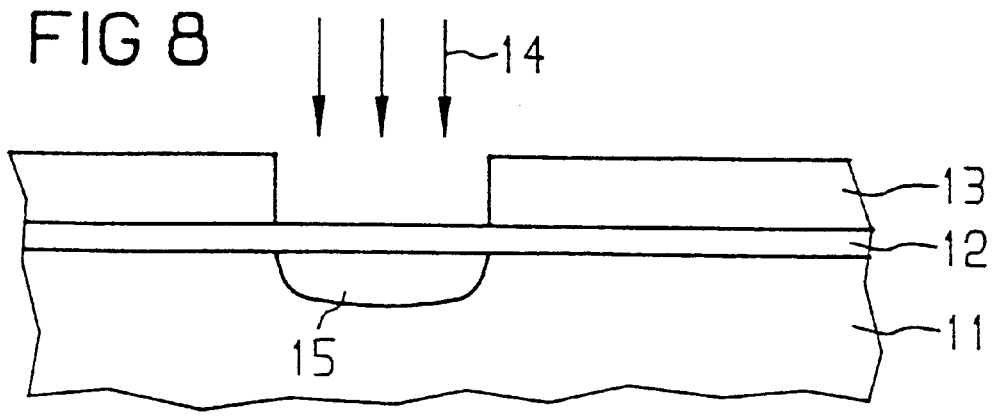
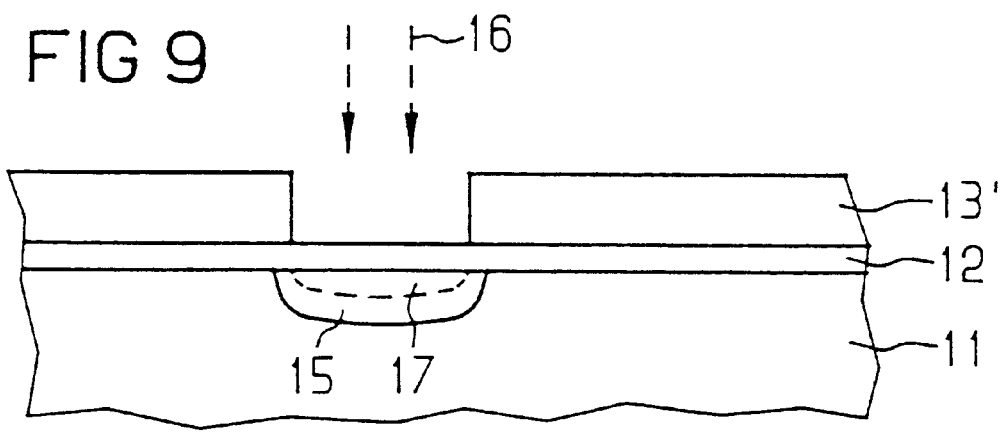
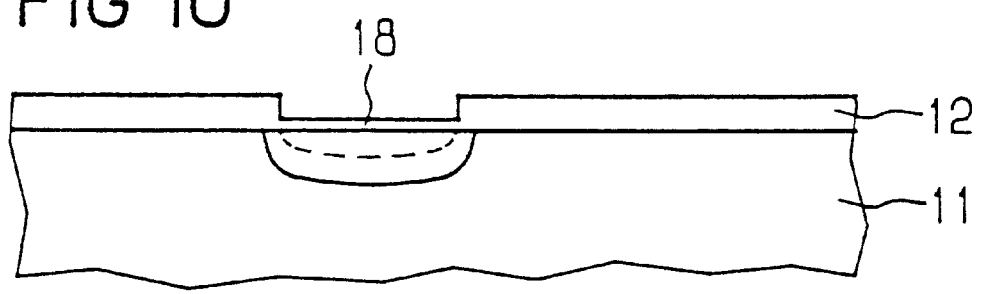

- - - - NET DOPING N
——— BOUNDARY SURFACE POTENTIAL

- - - - NET DOPING N
——— BOUNDARY SURFACE POTENTIAL

METHOD OF MAKING A SEMICONDUCTOR COMPONENT WITH COMPENSATION IMPLANTATION

BACKGROUND OF THE INVENTION

Field of the Invention

The invention relates to a semiconductor component, in particular an EEPROM memory cell, having first and second doped zones of a first conduction type disposed in a semiconductor substrate of a second conduction type, and a channel zone in the semiconductor substrate between the two doped zones. The invention also relates to a method for producing a semiconductor component.

EEPROM (Electrically Erasable Programmable Read-Only Memories) cells play an ever more important role among types of memory. In the case of chip card applications, for instance, memory blocks of the FLOTOX (Floating Gate Tunnel Oxide) cell type are used, which are integrated into a microcontroller environment (embedded memories). There is a demand for ever smaller cells. A limiting factor is the shrinkability of a tunnel window with an associated electrical connection zone (buried channel). That limit is determined primarily by the properties of the device, as is described below and in German Published, Non-Prosecuted Patent Application DE 196 14 010 A1, owned by the assignee of the instant application.

The disadvantages of such prior art components and methods are that they require a great deal of space and do not have high electrical reliability, as is described in more detail below in the description of FIGS. 1–4.

SUMMARY OF THE INVENTION

It is accordingly an object of the invention to provide a semiconductor component with compensation implantation and a production method, which overcome the hereinafore-mentioned disadvantages of the heretofore-known products and methods of this general type and which provide an EPROM that does not require very much space and has high electrical reliability.

With the foregoing and other objects in view there is provided, in accordance with the invention, a semiconductor component, comprising a semiconductor substrate of a second conduction type; first and second doped zones of a first conduction type disposed in the semiconductor substrate, the first doped zone having a surface and a peripheral region; a channel zone disposed between the first and second doped zones in the semiconductor substrate, the channel zone having a surface; a tunnel dielectric partly covering the surface of the first doped zone and defining a given region of the first doped zone disposed under the tunnel dielectric; a gate dielectric covering the surface of the channel zone and the peripheral region of the first doped zone; and a gate electrode on the tunnel dielectric and on the gate dielectric; the peripheral region having a higher effective doping than the given region.

In accordance with another feature of the invention, the given region of the first doped zone contains one dopant of the first conduction type and one dopant of the second conduction type.

In accordance with a further feature of the invention, the dopant of the first conduction type is present in the peripheral region, and the dopant of the second conduction type has a concentration very much less than in the given region below the tunnel dielectric.

In accordance with an added feature of the invention, the dopant of the first conduction type is phosphorous and the dopant of the second conduction type is boron or gallium.

With the objects of the invention in view there is also provided a method for producing a semiconductor component, which comprises producing first and second doped zones of a first conduction type and a peripheral region of the first doped zone in a semiconductor substrate of a second conduction type; producing a channel zone between the first and second doped zones in the semiconductor substrate; producing a connection for the first doped zone; creating a gate dielectric on the semiconductor substrate covering a surface of the channel zone and the peripheral region of the first doped zone; applying a mask on the gate dielectric with an opening in a region of the mask for later application of a tunnel dielectric; producing a doped zone of a first conduction type under the opening by an implantation through the gate dielectric; performing a compensation implantation with a dopant of the second conduction type providing a lowered effective dopant concentration of the first conduction type in a region near a surface below the opening, after the two implantations; removing the gate dielectric inside the opening in the mask; removing the mask and baring a surface of the semiconductor substrate; creating a tunnel dielectric on the bared semiconductor substrate surface while partly covering a surface of the first doped zone with the tunnel dielectric; and producing a gate electrode on the tunnel dielectric and on an adjacent portion of the gate dielectric.

In accordance with another mode of the invention, there is provided a production method which comprises implantating the first doped zone with phosphorous.

In accordance with a further mode of the invention, there is provided a production method which comprises carrying out the compensation implantation with gallium.

In accordance with an added mode of the invention, there is provided a production method which comprises modifying lateral dimensions of the mask prior to the compensation implantation.

In accordance with an additional mode of the invention, there is provided a production method which comprises forming the mask of photoresist swelling prior to the compensation implantation.

In accordance with yet another mode of the invention, there is provided a production method which comprises carrying out the compensation implantation with boron.

In accordance with yet a further mode of the invention, there is provided a production method which comprises carrying out the compensation implantation prior to the implantation with the dopant of the first conduction type.

In accordance with a concomitant mode of the invention, there is provided a production method which comprises carrying out the compensation implantation with a lower dose than the implantation with the dopant of the first conduction type.

In the invention, the level of the potential barrier is adjusted through the use of the lateral dopant profile. The following discovery is utilized in this case: the weaker the effective doping in the buried channel, the higher the potential at the boundary surface (that is, the hole potential is lower). A high potential barrier can be attained through the use of a high potential in the buried channel and a low potential in the peripheral region, or in other words under the gate dielectric or at the boundary between the gate dielectric and the tunnel dielectric, or again through the use of weak doping in the buried channel and higher doping in the peripheral region. The lateral dopant profile in the vicinity of the semiconductor substrate surface accordingly has at least a local maximum in the peripheral region. The effective concentration of n-dopants is greater in the peripheral region than in a region below the tunnel window.

This kind of dopant profile can be attained since in addition to the implantation of the buried channel, a compensation implantation with dopant atoms of the opposite conduction type is performed, in which the lateral out-diffusion is less than in the buried channel implantation. The same implantation mask is used for this purpose, optionally modified.

Other features which are considered as characteristic for the invention are set forth in the appended claims.

Although the invention is illustrated and described herein as embodied in a semiconductor component with compensation implantation and a production method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 5–7 and FIGS. 8–10 are fragmentary, cross-sectional views of a semiconductor substrate, showing two embodiments for producing the semiconductor component.

DESCRIPTION OF THE PREFERRED EMBODIMENTS

Figure 1:
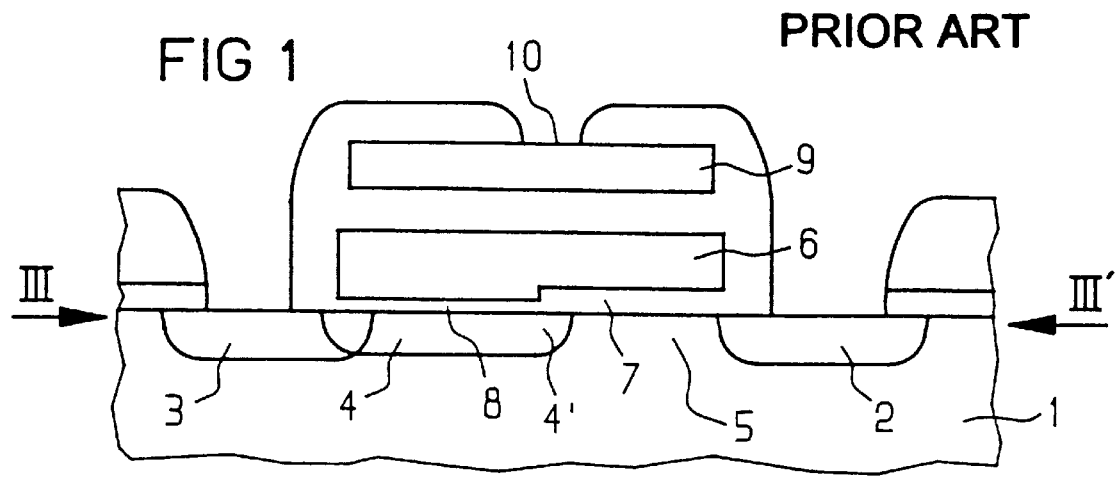
FIG. 1 is a fragmentary, diagrammatic, cross-sectional view of a semiconductor substrate with a known EEPROM memory cell.

Referring now to the figures of the drawings in detail and first, particularly, to FIG. 1 thereof, there is seen a diagrammatic representation of an EEPROM cell of the FLOTOX type. A p-doped semiconductor substrate 1 contains two n-doped zones 2, 3 as a source and a drain. A floating gate 6 is disposed on an intervening substrate surface and is divided on the substrate by a gate dielectric 7 and a tunnel dielectric 8. The floating gate 6 is "connected" to the drain 3 through the tunnel dielectric 8 (a so-called tunnel window) and through an n-doped zone 4 constructed as a buried channel. A region under a gate oxide of the memory transistor, which is a so-called channel zone 5, is weakly p-doped. The gate dielectric 7 covers not only the channel zone 5 but also a peripheral region 4' of the buried channel 4. A control gate 9 which is located above the floating gate 6 has a terminal 10. In order to carry out programming, approximately the following voltages are set:

$U_{controlgate}=0V$ $U_{Drain}=+15V$ $U_{Source}$:floating

Electrons can then pass from the floating gate through the potential barrier in the oxide into the conduction band of the oxide and then into the substrate. That is shown in the form of a band graph in FIG. 2. The electrons absorb enough energy to create pairs of electron holes in a substrate. (Holes have the tendency of running to higher potential, that is upward in the drawing, along an upper edge of a valence band, since the higher potential corresponds to a lower potential for holes.)

Figure 2:
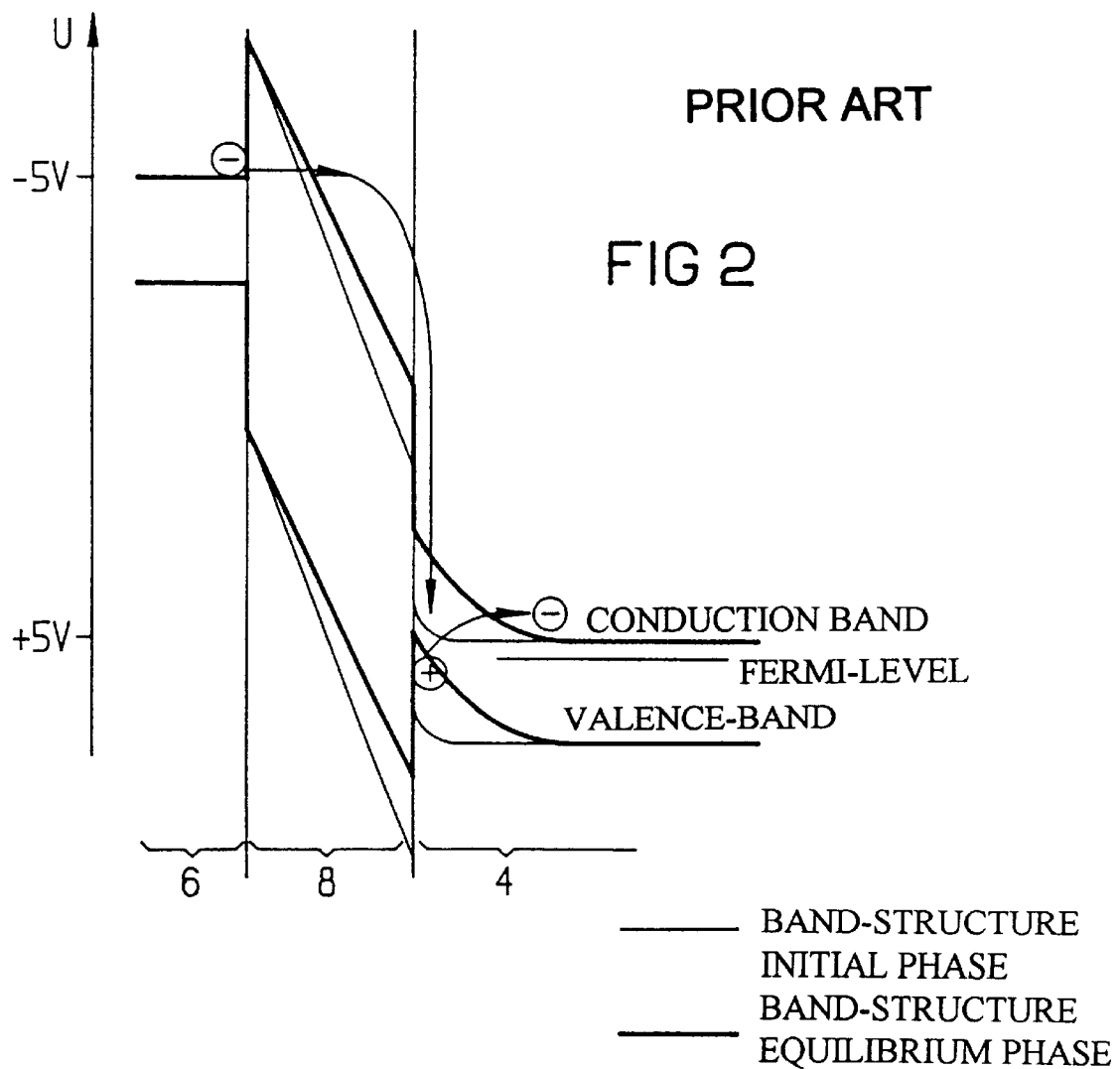
FIGS. 2–4 are graphs showing a course of potential in the semiconductor substrate along predetermined axes.
Figure 3:
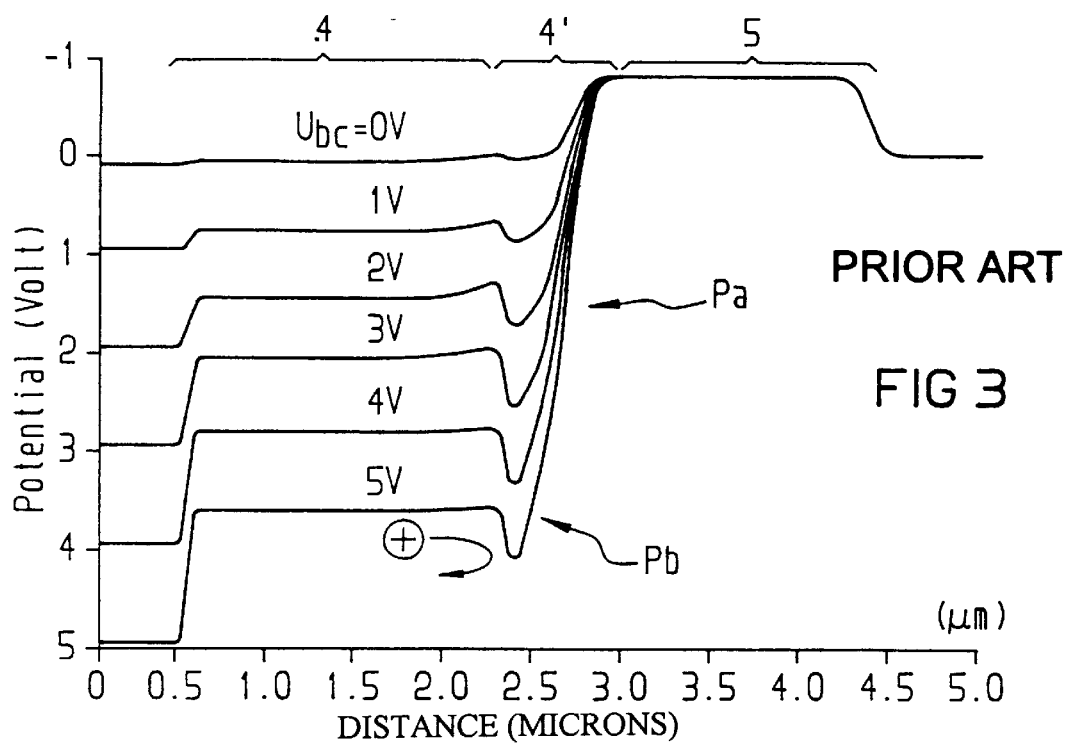

FIG. 3 shows a potential course for various values of $U_{buried channel}$ along the boundary surface at right angles to the plane of the drawing in FIG. 2 (that is along an axis III–III' in FIG. 1), if the lateral extent of the peripheral region 4' is great. The pn junction between the buried channel 4 (n-doped) and the substrate (p-doped) is polarized in the blocking direction at the voltages given. That leads to a pronounced potential gradient. At a transition from the tunnel to the gate dielectric, a small potential barrier Pb develops both in the conduction band and in the valence band, since the potential at the boundary surface depends on the thickness of the overlying dielectric: The hole potential in the tunnel oxide zone is higher than in the gate oxide zone. A hole potential drop Pa toward the p-zone ensues only with a dopant concentration drop. If the level of the potential barrier is still (for holes) above the buried channel potential, then holes cannot escape from the buried channel zone 4.

Figure 4:
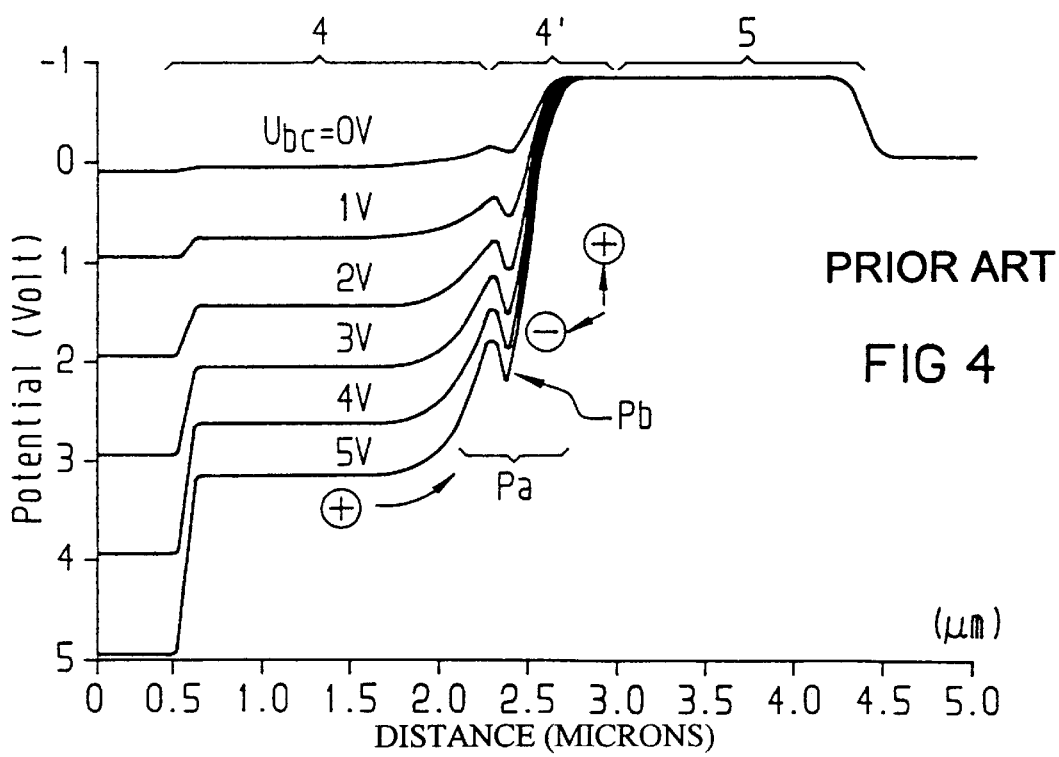

As is seen in FIG. 4, if the lateral extent of the peripheral region 4' under the gate dielectric 7 is inadequate, then the hole potential drop Pa begins earlier. The barrier Pb is located in a descending segment and drops below the buried channel level. The holes created by the tunnel electrons can therefore escape from the region under the tunnel dielectric 8 and can pass through the hole potential gradient to the channel zone 5. Holes are then no longer trapped in the buried channel zone. Further pairs of electron holes are thus created by impact ionization. The result is a charge multiplication, so that the current from the buried channel 4 to the channel zone 5, or in other words into the substrate 1, is higher by many orders of magnitude ($10^4$ to $10^6$) than the tunnel current. The charge pump for generating the programming voltage cannot furnish that current. The cells cannot be programmed in the requisite time of only a few milliseconds. The parasitic current created by the charge multiplication also burdens the tunnel oxide and thus reduces the cycling strength.

The level of the potential barrier is of decisive significance for the programming operation and for the electrical reliability of the components. It can be set in the following ways:

through the use of the lateral extent of the peripheral region 4';

through the use of the ratio between the thickness of the tunnel dielectric and that of the gate dielectric; and through the use of the lateral dopant profile around the gate oxide-tunnel oxide edge.

A high lateral out-diffusion of the n-doping element (usually phosphorous) is necessary to obtain an adequate extent of the peripheral region 4' under the gate dielectric 7. That can be attained by a high implantation dose. The spacing between the gate oxide-tunnel oxide edge and the source zone must be correspondingly great, so that the channel length of the memory transistor does not become too short as a result of the lateral diffusion. A high buried channel concentration has an extremely unfavorable effect on the quality of the tunnel oxide. Moreover, the adequate extent of the peripheral region 4' is usually assured by using two different masks for defining the buried channel 4 and the tunnel window. In other words, the implantation mask for the buried channel has a larger opening than the etching mask for the tunnel window.

Another way of avoiding the avalanche breakdown is by a greater ratio of the thickness of the gate to the tunnel dielectric ($\geq 4$). If that ratio were to be lowered, one would come up against the lateral shrink limits of the component.

Referring now to the invention, it is seen that FIG. 5 shows a p-doped silicon substrate 11, a gate dielectric 12, for instance a gate oxide that is 20 nm thick, applied on the silicon substrate 11, and a mask 13 applied over the gate dielectric 12. The mask 13 has an opening at a location of a later buried channel or tunnel window, through which an n-dopant 14, such as phosphorous, is implanted. The gate oxide 12 functions as a diffusion oxide. An n-doped region 15 in the substrate 11 is the result. Next, a compensation implantation is performed using the same mask 13, by implanting a p-dopant 16 that has a lower diffusion speed. The implantation dose is smaller than in the buried channel implantation, so that in the semiconductor substrate a further doped region 17 within the doped region 15 is created that has a weaker n-doping than the region 15. The buried channel implantation is performed with phosphorous at an implantation energy of 150 keV and an implantation dose of $4 \times 10^{14}$ cm$^{-2}$, while the compensation implantation is performed, for instance, with gallium at an implantation energy of 100 keV and an implantation dose of $1 \times 10^{13}$ cm$^{-2}$.

FIG. 6 shows that by using the mask 13, the gate oxide is etched and then the mask is removed, and an oxide 18 that is approximately 8 nm thick is applied as the tunnel dielectric, creating a tunnel window.

The EEPROM cell which is finished by known methods is show in FIG. 7. Due to resultant temperature stresses or those occurring as a consequence of an independently employed temperature step, a first doped zone 19, which is designated as a buried channel, is formed from the doped zone 15 and the further doped zone 17. A peripheral region 19' of the doped zone 19 extends under the gate oxide 12.

This peripheral region 19' has a higher effective doping than a portion of the first doped zone 19 that is located directly below the tunnel oxide. The cause of this lateral dopant profile is the fact that gallium only diffuses very slowly in comparison with phosphorous, so that the compensation implantation lowers the net doping essentially only under the tunnel window (that is, in the region of the further doped zone 17), but not outside the tunnel window (that is, in particular not in the above-defined peripheral region 19' under the gate oxide). The concentration of p-dopant atoms in the peripheral region is very much lower (typically by at least two orders of magnitude) than under the tunnel window.

The EEPROM also has a gate electrode 20 as a floating gate, which is disposed on the tunnel oxide 18 and the gate oxide 12, as well as an electrode 21 as a control gate which is applied in insulated fashion thereon. The control gate can be connected from outside. The EEPROM is completed with a second n-doped zone 22, and a region of the semiconductor substrate located between the first doped zone 19 and the second doped zone 22 represents a so-called channel zone 23 and is covered on its surface by the gate oxide 12. An n-doped zone 24 serves the purpose of connecting the buried channel 19. The floating gate 20 and the control gate 21 are encapsulated with an insulation 25.

Figure 12:
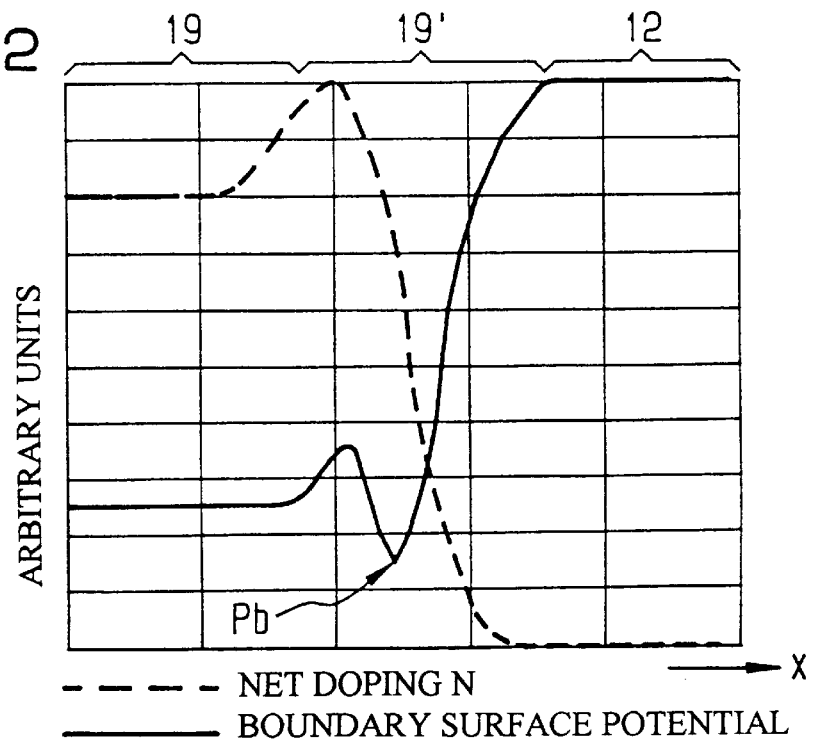

Due to the lateral dopant profile in the semiconductor substrate at the transition from the buried channel 19 to the channel zone 23, which is shown in FIG. 12, the potential in the buried channel is raised (or the hole potential in the buried channel is lowered), while conversely this is not the case in the region of the carrier (peripheral region 19'). This effectively raises the potential barrier. In order to obtain a potential barrier of a given height, a phosphorous implantation dose that is reduced as compared with conventional methods is necessary, and the lateral out-diffusion of the phosphorous can be lessened. In order to provide the same length of the channel zone 23, a shorter distance between the tunnel window edge and the second n-doped zone 22 (referred to as the source) is therefore feasible.

According to FIG. 8, in the case of the second exemplary embodiment for producing the semiconductor component, the point of departure is again a p-silicon substrate 11 with a gate oxide 12 and a mask 13. An n-dopant 14 is implanted, creating an n-doped zone 15 in the semiconductor substrate 11.

Preferably, phosphorous is implanted with an implantation energy of 150 keV and an implantation dose of $4 \times 10^{14}$ cm$^{-2}$.

FIG. 9 shows that the size of the opening in the mask 13 is then changed. For instance, for a mask made of photoresist, the opening is reduced in size by swelling, resulting in a modified mask 13'. The so-called CARL technique (an acronym for the German term for Chemical Expansion of Resist Lines), as is described in Published European Patent Application 0 395 917, can be employed for that purpose. Next, the compensation implantation is effected with a p-dopant, such as boron with an implantation energy of 10 keV and an implantation dose of $1 \times 10^{13}$ cm$^{-2}$, so that a further doped zone 17 is created. This zone 17 is located entirely inside the n-doped zone 15, and in particular it has smaller lateral dimensions on the substrate surface.

Next, according to FIG. 10, by using the modified mask 13', the gate oxide 12 is removed and a tunnel oxide 18 is applied. The remaining procedure is as in the first exemplary embodiment.

The modification of the implantation mask 13 can also be carried out in some other way, for instance by making spacers on side walls bordering the opening. The order of the implantations can also be transposed. In other words, the compensation implantation can be performed first, then the opening in the mask can be enlarged, and finally the buried channel implantation can be performed.

Figure 11:
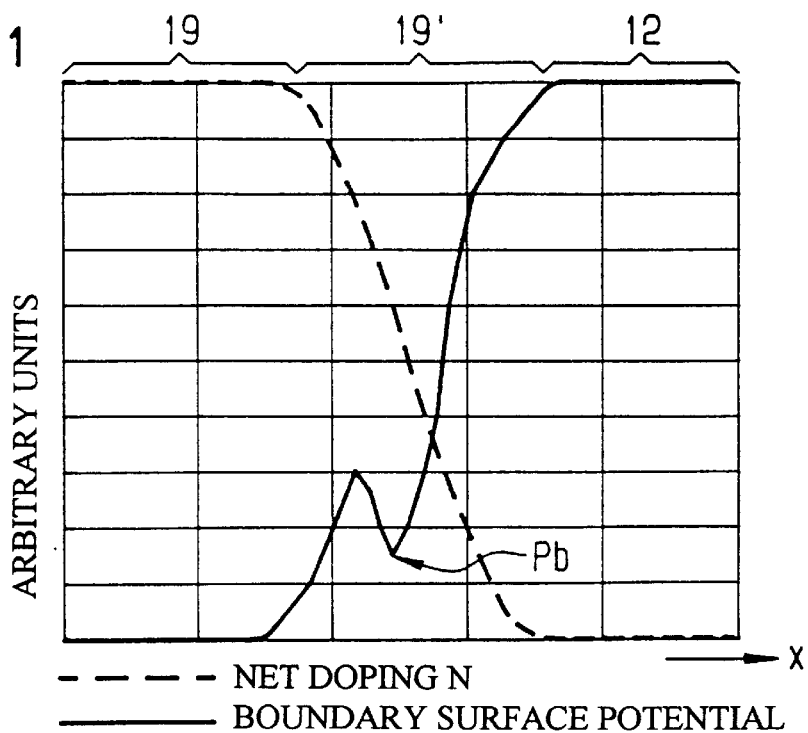
FIGS. 11 and 12 are graphs respectively showing a lateral dopant profile and a boundary surface profile, without and with compensation implantation.

FIG. 11 shows a lateral dopant profile along the X axis III–III' of FIG. 1 (n net doping) in arbitrary units as a dashed line, and the resultant boundary surface potential as a solid line. It can be seen that given monotonal variation of the net doping (as is also shown in FIG. 4), the potential barrier Pb in the descending segment of the hole potential drops.

FIG. 12 shows the same variables as in FIG. 11 (taken along an axis XII–XII' of FIG. 7), in which a compensation implantation has been carried out. This produces a local maximum of the effective doping in the peripheral region 19' and lowers the hole potential in the region of the tunnel window 18. The potential barrier Pb represents a maximum for the hole potential, so that an avalanche breakdown is averted. In a EEPROM, the charge multiplication in the programming process is so slight that even a weakly dimensioned charge pump can maintain the programming voltage.

We claim:

1. A method for producing a semiconductor component, which comprises:

providing a semiconductor substrate of a first conduction type;

creating a gate dielectric on the semiconductor substrate;

applying a mask on the gate dielectric with an opening in a region of the mask for later application of a tunnel dielectric;

producing a first doped zone of a second conduction type under the opening by an implantation through the gate dielectric;

performing a compensation implantation with a dopant of the first conduction type providing a lowered effective dopant concentration of the second conduction type in a region near a surface below the opening, after the two implantations;

removing the gate dielectric inside the opening in the mask;

removing the mask and baring a surface of the semiconductor substrate;

creating the tunnel dielectric on the bared semiconductor substrate surface while partly covering a surface of the first doped zone with the tunnel dielectric;

producing the gate electrode on the tunnel dielectric and on an adjacent portion of the gate dielectric;

producing a second doped zone of a second conduction type in the semiconductor substrate;

providing a region underneath the gate dielectric and between the first doped zone and the second doped zone that defines a channel zone; and producing a connection for the first doped zone.

2. The production method according to claim 1, which comprises implantating the first doped zone with phosphorous.

3. The production method according to claim 1, which comprises carrying out the compensation implantation with gallium.

4. The production method according to claim 1, which comprises modifying lateral dimensions of the mask prior to the compensation implantation.

5. The production method according to claim 4, which comprises forming the mask of photoresist swelling prior to the compensation implantation.

6. The production method according to claim 4, which comprises carrying out the compensation implantation with boron.

7. The production method according to claim 4, which comprises carrying out the compensation implantation with boron.

8. The production method according to claim 1, which comprises carrying out the compensation implantation prior to the implantation with the dopant of the second conduction type.

9. The production method according to claim 1, which comprises carrying out the compensation implantation with a lower dose than the implantation with the dopant of the second conduction type.

* * * * *